United States Patent
Bang et al.

(10) Patent No.: US 7,935,569 B2
(45) Date of Patent: May 3, 2011

(54) COMPONENTS, METHODS AND ASSEMBLIES FOR STACKED PACKAGES

(75) Inventors: Kyong-Mo Bang, San Jose, CA (US);
David Gibson, San Jose, CA (US);
Young-Gon Kim, San Jose, CA (US);
John B. Riley, III, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 279 days.

(21) Appl. No.: 11/975,996

(22) Filed: Oct. 23, 2007

(65) Prior Publication Data

US 2008/0042274 A1 Feb. 21, 2008

Related U.S. Application Data

(62) Division of application No. 10/656,534, filed on Sep. 5, 2003, now Pat. No. 7,294,928.

(60) Provisional application No. 60/408,644, filed on Sep. 6, 2002.

(51) Int. Cl.
*H01L 21/00* (2006.01)

(52) U.S. Cl. .............................. 438/107; 257/E21.705

(58) Field of Classification Search .................. 438/108, 438/107, 109; 257/E21.705
See application file for complete search history.

(56) References Cited

U.S. PATENT DOCUMENTS

| | | |
|---|---|---|
| 3,390,308 A | 6/1968 | Marley |
| 3,923,359 A | 12/1975 | Newsam |
| 4,371,744 A | 2/1983 | Badet et al. |
| 4,371,912 A | 2/1983 | Guzik |
| 4,489,364 A | 12/1984 | Chance |
| 4,540,226 A | 9/1985 | Thompson et al. |
| 4,551,746 A | 11/1985 | Gilbert et al. |
| 4,558,397 A | 12/1985 | Olsson |
| 4,638,348 A | 1/1987 | Brown et al. |
| 4,734,825 A | 3/1988 | Peterson |
| 4,754,316 A | 6/1988 | Reid |
| 4,761,681 A | 8/1988 | Reid |
| 4,841,355 A | 6/1989 | Parks |
| 4,868,712 A | 9/1989 | Woodman |
| 4,897,918 A | 2/1990 | Osaka et al. |

(Continued)

FOREIGN PATENT DOCUMENTS

JP 52-075981 6/1977

(Continued)

OTHER PUBLICATIONS

Damberg, U.S. Appl. No. 60/401,391, filed Aug. 5, 2002.

(Continued)

*Primary Examiner* — Evan Pert
(74) *Attorney, Agent, or Firm* — Lerner, David, Littenberg, Krumholz & Mentlik, LLP

(57) ABSTRACT

A bottom unit including a bottom unit semiconductor chip is mounted to a circuit board and one or more top elements such as packaged semiconductor chips are mounted to the bottom unit. Both mounting operations can be performed using the same techniques as commonly employed for mounting components to a circuit board. Ordinary packaged chips can be employed as the top elements, thereby reducing the cost of the assembly and allowing customization of the assembly by selecting packaged chips. The assembly achieves benefits similar to those obtained with a preassembled stacked chip unit, but without the expense of special handling of the bare dies included in the packaged chips.

16 Claims, 5 Drawing Sheets

U.S. PATENT DOCUMENTS

| | | |
|---|---|---|
| 4,956,694 A | 9/1990 | Eide |
| 4,982,265 A | 1/1991 | Watanabe et al. |
| 4,994,902 A | 2/1991 | Okahashi et al. |
| 4,996,583 A | 2/1991 | Hatada |
| 4,996,587 A | 2/1991 | Hinrichsmeyer et al. |
| 5,028,986 A | 7/1991 | Sugano et al. |
| 5,045,921 A | 9/1991 | Lin et al. |
| 5,117,282 A | 5/1992 | Salatino |
| 5,128,831 A | 7/1992 | Fox, III et al. |
| 5,138,438 A | 8/1992 | Masayuki et al. |
| 5,148,265 A | 9/1992 | Khandros et al. |
| 5,172,303 A | 12/1992 | Bernardoni et al. |
| 5,198,888 A | 3/1993 | Sugano et al. |
| 5,222,014 A | 6/1993 | Lin |
| 5,239,198 A | 8/1993 | Lin et al. |
| 5,247,423 A | 9/1993 | Lin et al. |
| 5,266,912 A | 11/1993 | Kledzik |
| 5,281,852 A | 1/1994 | Normington |
| 5,311,401 A | 5/1994 | Gates, Jr. et al. |
| 5,313,096 A | 5/1994 | Eide |
| 5,334,875 A | 8/1994 | Sugano et al. |
| 5,337,077 A | 8/1994 | Browne |
| 5,376,825 A | 12/1994 | Tukamoto et al. |
| 5,384,689 A | 1/1995 | Shen |
| 5,397,916 A | 3/1995 | Normington |
| 5,412,247 A | 5/1995 | Martin |
| 5,455,740 A | 10/1995 | Burns |
| 5,479,318 A | 12/1995 | Burns |
| 5,489,749 A | 2/1996 | DiStefano et al. |
| 5,518,964 A | 5/1996 | DiStefano et al. |
| 5,543,664 A | 8/1996 | Burns |
| 5,548,091 A | 8/1996 | DiStefano et al. |
| 5,552,631 A | 9/1996 | McCormick |
| 5,552,963 A | 9/1996 | Burns |
| 5,600,541 A | 2/1997 | Bone et al. |
| 5,608,265 A | 3/1997 | Kitano et al. |
| 5,616,958 A | 4/1997 | Laine et al. |
| 5,625,221 A | 4/1997 | Kim et al. |
| 5,637,536 A | 6/1997 | Val et al. |
| 5,639,695 A | 6/1997 | Jones et al. |
| 5,642,261 A | 6/1997 | Bond et al. |
| 5,656,856 A | 8/1997 | Kweon |
| 5,659,952 A | 8/1997 | Kovac et al. |
| 5,668,405 A | 9/1997 | Yamashita |
| 5,677,566 A | 10/1997 | King et al. |
| 5,679,977 A | 10/1997 | Khandros et al. |
| 5,681,777 A | 10/1997 | Lynch et al. |
| 5,701,031 A | 12/1997 | Oguchi et al. |
| 5,715,144 A * | 2/1998 | Ameen et al. ................ 361/790 |
| 5,734,555 A | 3/1998 | McMahon |
| 5,751,063 A | 5/1998 | Baba |
| 5,783,870 A | 7/1998 | Mostafazadeh et al. |
| 5,784,264 A | 7/1998 | Tanioka |
| 5,801,072 A | 9/1998 | Barber |
| 5,801,439 A | 9/1998 | Fujisawa et al. |
| 5,804,874 A | 9/1998 | An et al. |
| 5,834,339 A | 11/1998 | DiStefano et al. |
| 5,835,988 A | 11/1998 | Ishii et al. |
| 5,844,315 A | 12/1998 | Melton et al. |
| 5,861,666 A | 1/1999 | Bellaar |
| 5,883,426 A | 3/1999 | Tokuno et al. |
| 5,915,752 A | 6/1999 | DiStefano et al. |
| 5,956,234 A | 9/1999 | Mueller |
| 6,002,167 A | 12/1999 | Hatano et al. |
| 6,030,856 A | 2/2000 | DiStefano et al. |
| 6,054,756 A | 4/2000 | DiStefano et al. |
| 6,072,233 A | 6/2000 | Corisis et al. |
| 6,093,029 A | 7/2000 | Kwon et al. |
| 6,137,164 A | 10/2000 | Yew et al. |
| 6,180,881 B1 | 1/2001 | Isaak |
| 6,184,577 B1 | 2/2001 | Takemura et al. |
| 6,195,268 B1 | 2/2001 | Eide |
| 6,218,848 B1 | 4/2001 | Hembree et al. |
| 6,232,152 B1 | 5/2001 | DiStefano et al. |
| 6,268,649 B1 | 7/2001 | Corisis et al. |
| 6,281,042 B1 * | 8/2001 | Ahn et al. ..................... 438/108 |
| 6,291,259 B1 | 9/2001 | Chun |
| 6,300,161 B1 | 10/2001 | Goetz et al. |
| 6,303,997 B1 | 10/2001 | Lee et al. |
| 6,313,522 B1 | 11/2001 | Akram et al. |
| 6,335,565 B1 | 1/2002 | Miyamoto et al. |
| 6,337,510 B1 | 1/2002 | Chun-Jen et al. |
| 6,342,728 B2 | 1/2002 | Miyazaki et al. |
| 6,344,682 B1 | 2/2002 | Tomita |
| 6,359,235 B1 | 3/2002 | Hayashi |
| 6,369,445 B1 | 4/2002 | Khoury |
| 6,376,917 B1 | 4/2002 | Takeshita et al. |
| 6,388,264 B1 | 5/2002 | Pace |
| 6,388,333 B1 | 5/2002 | Taniguchi et al. |
| 6,407,448 B2 | 6/2002 | Chun |
| 6,414,384 B1 | 7/2002 | Lo et al. |
| 6,437,990 B1 | 8/2002 | Degani et al. |
| 6,462,421 B1 | 10/2002 | Hsu et al. |
| 6,476,331 B1 | 11/2002 | Kim et al. |
| 6,479,321 B2 | 11/2002 | Wang et al. |
| 6,496,026 B1 | 12/2002 | Long et al. |
| 6,515,870 B1 | 2/2003 | Skinner et al. |
| 6,521,845 B1 | 2/2003 | Barrow |
| 6,680,212 B2 | 1/2004 | Degani et al. |
| 6,734,539 B2 | 5/2004 | Degani et al. |
| 6,765,288 B2 | 7/2004 | Damberg |
| 7,294,928 B2 | 11/2007 | Bang et al. |
| 2001/0046129 A1 | 11/2001 | Broglia et al. |
| 2002/0079568 A1 * | 6/2002 | Degani et al. ................ 257/686 |
| 2002/0081755 A1 | 6/2002 | Degani et al. |
| 2002/0127771 A1 | 9/2002 | Akram et al. |
| 2003/0042587 A1 * | 3/2003 | Lee ............... 257/678 |
| 2003/0042591 A1 * | 3/2003 | Goller et al. ................ 257/686 |
| 2003/0110452 A1 | 6/2003 | Leahy et al. |
| 2003/0122240 A1 * | 7/2003 | Lin et al. ....................... 257/686 |
| 2004/0021210 A1 * | 2/2004 | Hosomi ........................ 257/686 |
| 2004/0021211 A1 * | 2/2004 | Damberg ...................... 257/686 |
| 2004/0145054 A1 | 7/2004 | Bang et al. |
| 2004/0178508 A1 | 9/2004 | Nishimura et al. |
| 2004/0232564 A1 | 11/2004 | Cher'Khng et al. |

FOREIGN PATENT DOCUMENTS

| | | |
|---|---|---|
| JP | 56-61151 | 5/1981 |
| JP | 57-31166 A1 | 2/1982 |
| JP | 58-178529 | 10/1983 |
| JP | 60-194548 | 3/1984 |
| JP | 61-029140 | 2/1986 |
| JP | 61-101067 | 5/1986 |
| JP | 61-120454 | 6/1986 |
| JP | 61-137335 | 6/1986 |
| JP | 61-255046 | 11/1986 |
| JP | 63-18654 | 1/1988 |
| JP | 62-226307 | 3/1989 |
| JP | 64-71162 | 3/1989 |
| WO | 03019654 A1 | 3/2003 |

OTHER PUBLICATIONS

"Megabyte Per Cubic Inch," Defense Science, May 1988, p. 56.
"Three-Dimensional Packaging," Defense Science, May 1988, p. 65.
Newsam, U.S. Appl. No. 60/314,042, filed Aug. 22, 2001.
Forthun, U.S. Appl. No. 07/552,578, filed Jul. 13, 1990.

* cited by examiner

COMPONENTS, METHODS AND ASSEMBLIES FOR STACKED PACKAGES

CROSS-REFERENCE TO RELATED APPLICATIONS

This application is a divisional of U.S. patent application Ser. No. 10/656,534, filed on Sep. 5, 2003. Said U.S. patent application Ser. No. 10/656,534, filed on Sep. 5, 2003 claims the benefit of U.S. Provisional Patent Application Ser. No. 60/408,644, filed on Sep. 6, 2002. The aforesaid applications are hereby incorporated by reference herein.

BACKGROUND OF THE INVENTION

The present invention relates to microelectronic assemblies and to components and methods used for making the same.

Microelectronic elements such as semiconductor chips ordinarily are mounted on circuit panels such as circuit boards. For example, a packaged semiconductor chip may have an array of bonding contacts on a bottom surface of the package. Such a package can be mounted to a corresponding array of bonding contacts exposed at a top surface of a circuit board by placing the package on the circuit board with the bottom surface of the package facing downwardly and confronting the top surface of the circuit board, so that each bonding contact on the package is aligned with a corresponding bonding contact on the circuit board. Masses of a conductive bonding material, typically in the form of solder balls, are provided between the bonding contacts of the package and the bonding contacts of the circuit board. In typical surface-mounting techniques, solder balls are placed on the bonding contacts of the package before the package is applied to the circuit board.

Ordinarily, numerous microelectronic elements are mounted side-by-side on the circuit board and interconnected to one another by electrically conductive traces connecting the various bonding contacts. Using this conventional approach, however, the circuit board must have an area at least equal to the aggregate area of all of the microelectronic elements. Moreover, the circuit board must have all of the traces needed to make all of the interconnections between microelectronic elements. In some cases, the circuit board must include many layers of traces to accommodate the required interconnections. This materially increases the cost of the circuit board. Typically, each layer extends throughout the entire area of the circuit board. Stated another way, the number of layers in the entire circuit board is determined by the number of layers required in the area of the circuit board having the most complex, densely packed interconnections. For example, if a particular circuit requires six layers of traces in one small region but only requires four layers in the remainder of the circuit board, the entire circuit board must be fabricated as a six-layer structure.

These difficulties can be alleviated to some degree by connecting related microelectronic elements to one another using an additional circuit panel so as to form a sub-circuit or module which, in turn, is mounted to the main circuit board. The main circuit board need not include the interconnections made by the circuit panel of the module. It is possible to make such a module in a "stacked" configuration, so that some of the chips or other microelectronic elements in the module are disposed on top of other chips or microelectronic elements in the same module. Thus, the module as a whole can be mounted in an area of the main circuit board less than the aggregate area of the individual microelectronic elements in the module. However, the additional circuit panel and the additional layer of interconnections between this circuit panel and the main circuit board consume additional space. In particular, the additional circuit panel and additional layer of interconnections between the additional circuit panel and the main circuit panel add to the height of the module, i.e., the distance by which the module projects above the top surface of the main circuit board. This is particularly significant where the module is provided in a stacked configuration and where low height is essential, as, for example, in assemblies intended for use in miniaturized cellular telephones and other devices to be worn or carried by the user.

The additional space consumed by mounting pre-packaged semiconductor chips on a separate module circuit panel can be saved by integrating the circuit panel of the module with a part of the package itself, commonly referred to as a package substrate. For example, several bare or unpackaged semiconductor chips can be connected to a common substrate during the chip packaging operation. Packages of this nature can also be made in a stacked arrangement. Such multi-chip packages can include some or all of the interconnections among the various chips in the package and can provide a very compact assembly. The main circuit board can be simpler than that which would be required to mount individual packaged chips in the same circuit. However, this approach requires unique packages for each combination of chips to be included in the package. For example, in the cellular telephone industry, it is a common practice to use the same field programmable gate array ("FPGA") or application specific integrated circuit ("ASIC") with different combinations of static random access memory ("SRAM") and flash memory so as to provide different features in different cellular telephones. This increases the costs associated with producing, handling and stocking the various packages.

SUMMARY OF THE INVENTION

One aspect of the present invention provides methods of operating a production plant adapted for attaching packaged semiconductor chips, modules and other components to a circuit board, commonly referred to as a "circuit board stuffing" production plant. A method of operation according to this aspect of the invention desirably includes the steps of mounting bottom units to circuit boards in a board-stuffing plant. Each bottom unit desirably includes one or more chips, and each bottom unit desirably is mounted to the circuit board by connecting board connections on the bottom side of the unit with a circuit board. The bottom units desirably have top connections on their top sides. A method according to this aspect of the invention desirably also includes the steps of procuring packaged chips and mounting the packaged chips to the top connections of the units in the board-stuffing plant. Preferably, the top connections or each bottom unit include top contacts overlying the one or more chips of the bottom unit, and the step of mounting the packaged chip to such a bottom unit includes connecting the packaged chip to these top contacts, so that the packaged chip is disposed in whole or in part above the chip incorporated in the bottom unit. In this arrangement, a stacked assembly of semiconductor chips is made by placing the packaged chip on the bottom unit. In essence, the stacked arrangement of chips is fabricated within the circuit board stuffing plant, so that the same need not be specially ordered. Most preferably, the step of procuring packaged chips includes procuring packaged chips of the same functionality from a plurality of sources. Most preferably, the packaged chips are standard packaged chips, i.e., chips conforming to an official or unofficial industry standard, as further discussed below. Such standard packaged chips commonly are available from multiple sources at highly competitive prices.

In one arrangement, the step of mounting the bottom units is performed while the top connections of the bottom units are unfilled, i.e., before mounting the packaged chips to top connections. The step of mounting the packaged chips to the top connections desirably is performed using the same production line as the step of mounting the bottom units to the circuit boards. Thus, the production process in the board-stuffing plant involves placing the bottom units on the circuit board and then placing the packaged chips on the bottom units. All of these steps desirably can be performed using standard surface-mounting equipment and techniques.

A further aspect of the present invention provides a semi-finished circuit board assembly which includes a circuit board having a top surface and contact pads exposed at the top surface. The semi-finished assembly further includes a bottom unit incorporating at least one semiconductor chip. Most preferably, the bottom unit has mounting connections facing downwardly toward the circuit board and top connections facing upwardly away from the circuit board, at least some of the mounting connections being aligned with at least some of the contact pads on the circuit board and, most preferably, bonded to those contact pads. Most desirably, at least some of the top connections in the semi-finished circuit board assembly are unoccupied and are available to receive one or more additional microelectronic devices. Desirably, the top connections are adapted for surface mounting of additional microelectronic devices to the top connections. In a particularly preferred arrangement, the top connections include top conductive pads which are disposed in a pattern corresponding to the pattern specified in a standard for pads on a circuit board to receive a microelectronic element such as a standard packaged chip.

Yet another aspect of the present invention provides a multi-chip assembly which includes a bottom unit incorporating at least one bottom unit semiconductor chip, the bottom unit having downwardly-facing mounting pads and upwardly-facing top connection pads. The assembly desirably further includes mounting masses of a fusible electrically-conductive bottom bonding material, the mounting masses being disposed in contact with the mounting pads of the bottom unit. A multi-chip assembly according to this aspect of the invention preferably includes a first packaged semiconductor chip having terminals overlying at least some of the top connection pads and a top conductive bonding material connecting at least some of the top connection pads on at least some of the terminals of the first packaged semiconductor chip, the top conductive bonding material having lesser height than the mounting masses. For example, the top conductive bonding material may be provided in layers less than about 40 microns high, whereas the mounting masses typically are at least about 100 microns high. The assembly may further include a circuit panel having a top surface and contact pads exposed at the top surface, the mounting masses being disposed between the mounting pads of the bottom unit and the contact pads of the circuit panel.

The bottom unit desirably includes a substrate. At least a portion of the substrate preferably extends above the bottom unit semiconductor chip, and at least some of the top connection pads desirably are disposed on that portion of the substrate which overlies the bottom unit semiconductor chip. For example, the substrate may be a generally planar sheet or board and may include a central portion overlying the first bottom unit chip and at least one peripheral portion projecting outwardly beyond the edges of that chip. The mounting pads desirably are disposed in the peripheral portion or portions, such that the mounting masses extend downwardly from the mounting pads beyond the first bottom unit chip. In another arrangement, the substrate may include an upper portion extending above the first bottom unit chip and a lower portion extending beneath the first bottom unit chip, the top connection pads being disposed on the upper portion. For example, the substrate may be formed by folding a sheet-like dielectric element, so that one portion of the folded element constitutes the upper portion and another portion constitutes the lower portion, and the bottom unit chip may be disposed between the upper and lower portions.

Yet another aspect of the present invention provides an assembly incorporating a bottom unit which, again, includes a first bottom unit semiconductor chip and a substrate having a portion extending over the bottom unit semiconductor chip. The substrate also has upwardly-facing top connection pads and downwardly-facing mounting pads, at least some of the top connection pads being disposed in that portion of the substrate which overlies the bottom unit semiconductor chip. The mounting pads are adapted for connection to contact pads on a circuit board. Most preferably, in assembly according to this aspect of the invention, the bottom unit semiconductor chip is permanently connected to the substrate. Desirably, the substrate serves as a package element for the bottom unit semiconductor chip. The assembly desirably further includes a first top microelectronic element which at least partially overlies the aforementioned portion of the substrate so that the first top microelectronic element is disposed at least partially over the bottom unit semiconductor chip. Most preferably, the top microelectronic element is removably mounted to the substrate and connected to the top connection pads. As further discussed below, the top microelectronic element desirably is removably mounted to the substrate in such a way that the top microelectronic element can be removed from the substrate without destroying the substrate. For example, the assembly may include a top conductive bonding material such as a solder electrically connecting the top microelectronic element to the top connection pads. The top microelectronic element may be attached to the substrate only by the top conductive bonding material. Thus, the joint between the top microelectronic element and the substrate desirably is a non-underfilled connection. The permanent attachment of the bottom unit semiconductor chip to the substrate may include, for example, an encapsulated or underfilled solder joint or an encapsulated wire-bonded connection. Assemblies of this type may include a circuit panel having contact pads thereon or masses of an electrically conductive bonding material extending between the mounting pads of the substrate and the contact pads of the circuit panel. Assemblies of this type can be readily re-worked by removing the top microelectronic element, if necessary, after testing the completed assembly including the circuit panel. The top microelectronic element can be removed and replaced while the bottom unit semiconductor chip and substrate remain in position on the circuit panel.

Yet another aspect of the invention provides an assembly which includes a bottom unit semiconductor chip having front and rear surfaces and having edges extending between these surfaces, together with a substrate having a central portion. The central portion of the substrate extends above the bottom unit semiconductor chip, and the bottom unit semiconductor chip desirably is mounted to the central portion of the substrate with one surface of the chip facing upwardly toward the substrate. The substrate also has one or more peripheral portions projecting outwardly beyond the edges of the bottom unit semiconductor chip. Most desirably, the substrate has first and second peripheral portions projecting beyond opposite edges of the bottom unit semiconductor chip. The assembly according to this aspect of the invention desirably includes first and second top microelectronic elements disposed above the substrate, at least one of the top microelectronic elements extending over the central portion and at least one of the top microelectronic elements extending over one or more of the peripheral portions. The substrate desirably includes mounting terminals electrically connected to at least one of said microelectronic elements, the mounting terminals being adapted for mounting the substrate to a circuit board. In a particularly preferred arrangement, the bottom unit microelectronic element has greater surface area than either the first or second top microelectronic elements taken alone. Most preferably, the bottom unit microelectronic element has a surface area less than the aggregate surface area of the first and second top microelectronic elements. Merely by way of example, the bottom unit microelectronic element may be an ASIC or FPGA, whereas the top microelectronic elements may include memory elements such as SRAM memory, flash memory or both. Because the top microelectronic elements extend out over the peripheral portions of the substrate and, desirably, above the mounting terminals, these elements occupy space which would otherwise be wasted.

Features of the various aspects of the invention may be combined with one another. For example, assemblies including one type of ASIC or FPGA with various types of memory elements can be fabricated in the circuit board stuffing plant using standard packaged memory chips. The only non-standard element which is employed is the pre-assembled bottom unit including the ASIC or FPGA and the substrate.

These and other objects, features and advantages of the present invention will be more readily apparent from the detailed description set forth below, taken in conjunction with the accompanying drawings.

DETAILED DESCRIPTION

A unit or subassembly 75 (FIGS. 1 and 2) in accordance with one embodiment of the invention includes a substrate 20 having a first or upper surface 22 and a second or bottom surface 24. The substrate incorporates a dielectric body which desirably is as thin as is practicable and which may be in the form of a flexible sheet. For example, the substrate may include one or more layers of dielectric such as polyimide, BT resin, epoxy or other polymers, which may incorporate reinforcements such as glass, carbon or polymeric fibers. Essentially any material which can be used in construction of rigid or flexible circuit boards can be used to form the dielectric body. As further discussed herein, the thickness of the dielectric body contributes to the overall height or vertical dimension of the completed assembly and accordingly it is preferred to make the thickness of the dielectric body as small as possible consistent with other requirements. Most commonly, flexible circuit boards having thickness between about 25 and about 75 microns are employed.

Figure 2:
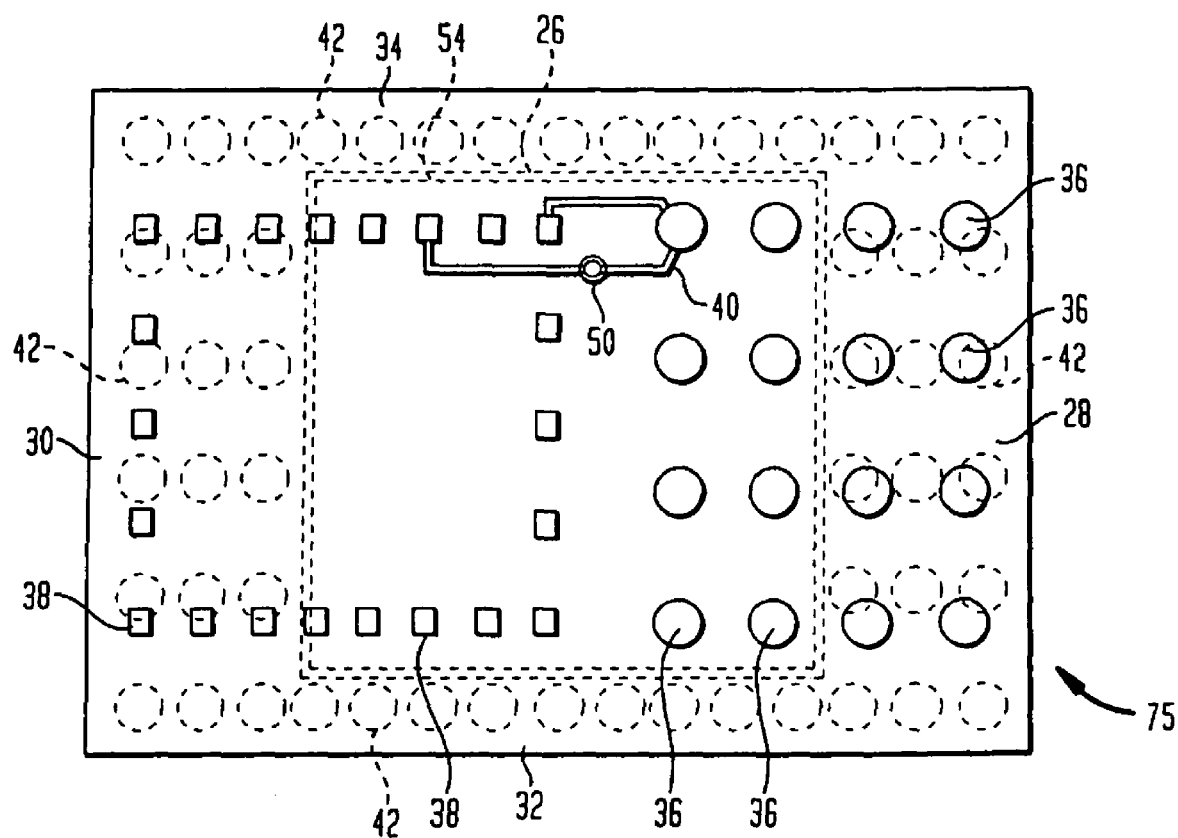
FIG. 2 is a diagrammatic top plan view of the component of FIG. 1.

The substrate has a central region 26 demarcated by a broken line in FIG. 2 and a peripheral portion including a first peripheral region 28 extending outwardly from the central region on one side and a second peripheral region 30 extending outwardly from the central region on the opposite side. In the particular embodiment shown, the substrate also has a third peripheral region 32 and a fourth peripheral region 34 extending outwardly from the central region 26 on the remaining sides of the central region. Although the peripheral and central regions are demarcated by a broken line in FIG. 2 for clarity of illustration, it should be appreciated that this demarcation typically is not visible; the substrate typically is a continuous plate or sheet.

A first set of top connection pads 36 is provided on the upper surface 22 of substrate 20. The first set of connection pads extends in part in the first peripheral region 28 and in part in the central region 26 of the substrate. A second set of top connection pads 38 is also provided on the upper surface 22 of the substrate. The second set of top connection pads extends in part in the second peripheral region 30 of the substrate and in part in the central region 26. In the particular embodiment illustrated, the first set of top connection pads 36 is in the form of an "area array" or array of pads disposed at substantially constant distances from one another throughout the area occupied by the array. The second set of pads 38 is in the form of pads disposed in rows extending around the area occupied by array 38. These arrangements are merely illustrative; essentially any pad configuration can be used.

Figure 1:
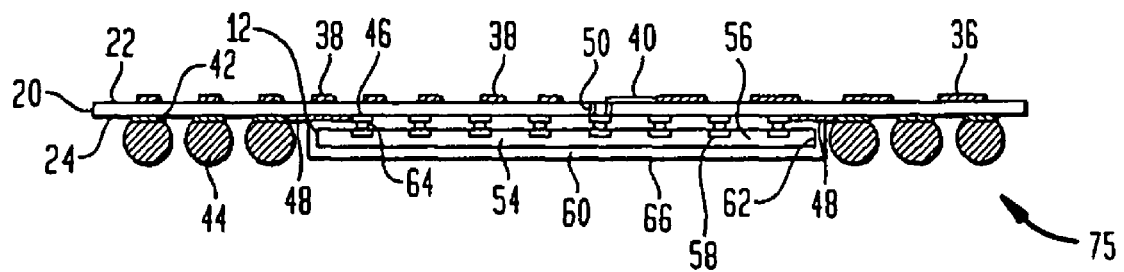
FIG. 1 is a diagrammatic sectional view of a component in accordance with one embodiment of the invention.

Most preferably, however, the pad configurations are in accordance with a standard pad configuration commonly used in a circuit board for mounting components such as chips by a surface mounting procedure. Certain standard pad configurations are set by standard setting bodies including the Joint Electronic Device Engineering Council ("JEDEC") of the Electronics Industry Alliance; by the Electronic Industry Association of Japan ("EIAJ") and by other standard setting bodies. As used in this disclosure, the term "official standard" refers to a standard adopted by a government or by an industry association, whereas the term "unofficial standard" refers to a package design which, although not conforming to an official standard has been adopted by numerous companies in the surface mounting industry. The top connection pads are of a type suitable for surface mounting and hence are formed from a solderable metal such as copper, preferably with a gold plating. Traces 40, which only one is shown in FIG. 1 for clarity of illustration, also extend along the upper surface of substrate 20. As further discussed below, traces 40 serve to interconnect the top connection pads with other conductive elements on the substrate. A solder mask layer (not shown) may cover traces 40 and the remainder of the upper surface except for pads 38 and 36.

The lower surface 24 of the substrate is provided with a set of mounting pads 42. The mounting pads 42 in this arrangement are provided in all of the peripheral regions 28, 30, 32 and 34 of the substrate, although the mounting pads in some of the peripheral regions may be omitted depending upon the number of connections to be made. Mounting pads 42 will ultimately be used to mount the assembly to a circuit panel as discussed below. Mounting pads 42 are provided with bottom or mounting masses 44 of a fusible electrically conductive material, desirably a solder. These masses may be of uniform composition or may include solid, non-fusible elements such as a solid core formed from a metal having a melting temperature higher than the melting temperature of the bonding material. As further discussed below, a bottom chip 54 is mounted on the lower surface 24 of substrate 20 and covered by an encapsulant 66. Masses 44 have a height greater than or equal to the height of encapsulant 66, and typically are more than 100 microns high, most commonly about 100 to about 500 microns high. Most commonly, the bottom masses 44 are substantially spherical and of about 100 to about 500 microns nominal diameter prior to reflowing.

Substrate 20 also has bottom chip connect pads 46 (FIG. 1) on lower surface 24 within central region 26 of the substrate. Additional traces 48 on the bottom surface connect at least some of the bottom chip connect pads 46 to at least some of the mounting pads 42. Moreover, the substrate has through conductive features such as vias 50 disposed at various locations for making connections between conductive features on the upper and lower surfaces. Only one such via is shown for clarity of illustration. In fact, numerous through connections are provided at various locations on the substrate so that the traces 48 and 30 and vias 50 cooperatively interconnect at least some of the various sets of top connection pads, mounting pads and bottom chip connection pads with one another as required to form the circuit needed in the finished assembly. Moreover, additional traces and other conductive features such as ground planes and power planes (not shown) can be provided on one or both surfaces of the substrate or within the substrate.

A first bottom unit semiconductor chip 54 is mounted beneath the substrate 20 in the central region 26. Chip 54 has a front or contact bearing surface 56 having contacts 58 thereon and a rear surface 60. The chip also has edges 62 bounding the front and rear surfaces and extending between the surfaces. In the particular embodiment depicted in FIGS. 1 and 2, first chip 54 is a bare die mounted with its front or contact bearing surface 56 facing upwardly, toward the substrate 20, and contacts 58 on the chip are bonded to the bottom chip connect pads 46 of the substrate by an electrically conductive bonding material 64. Bonding material 64 may be a solder, a eutectic bonding material or other known conductive bonding material. Rather than discrete masses of a conductive bonding material, an anisotropic conductive material may be applied as a layer between chip 54 and the lower surface 24 of the substrate. As is known in the art, such an anisotropic material will conduct appreciably in the direction through the layer but does not have appreciable conduction in directions along the plane of the layer.

An encapsulant 66 covers bottom unit chip 54 so that the encapsulant encompasses the rear surface 60 of the chip and also extends over the edges 62 of the chip and forms a bond with the lower surface 24 of the substrate. The encapsulant desirably also includes a portion extending between the bonding material masses 64 in the area occupied by the contacts 58 of the chip and the chip attach pads 46 of the substrate. This portion of the encapsulant serves as an "underfill" or layer between the surface 56 of the bottom unit chip 54 and the lower surface 24 of the substrate in those areas not occupied by the contacts and bonding materials. The encapsulant may have a uniform composition throughout. Alternatively, the encapsulant may include different materials having different physical properties in the underfill region between the chip and the substrate and in the overlying regions surrounding the exterior of the chip. The encapsulant may be a typical overmolding encapsulant of the type commonly used in packaging semiconductor dies. Encapsulant 66 and chip bonding material 64 permanently connect chip 54 to substrate 20. Thus, chip 54 cannot be removed from the substrate simply by melting or breaking bonding material 64.

The unit 75 discussed above with reference to FIGS. 1 and 2 acts as a package for the first or bottom unit chip 54. This component typically is assembled in a chip packaging plant equipped with the equipment necessary to handle any mount bare dies. The component, with or without bottom masses 44, desirably is shipped, stored and sold in the same manner as any other chip package. Also, the component can be tested by engaging some or all of the mounting pads and/or top connection pads with a test fixture.

Figure 3:
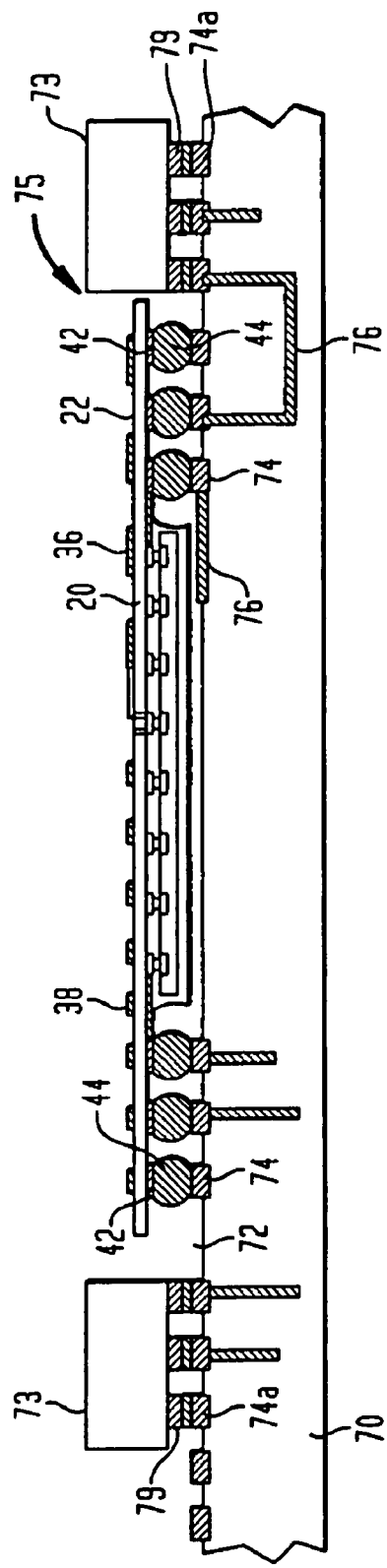
FIG. 3 is a view similar to FIG. 1 showing a semi-finished assembly including the component of FIGS. 1 and 2 in conjunction with additional elements.

In an assembly method according to a further embodiment of the invention, unit 75 of FIGS. 1 and 2 is mounted to a circuit board 70 (FIG. 3). Circuit board 70 is a conventional circuit board having a top or first surface 72 and contact pads 74 exposed at the top surface. The circuit board also has conventional traces 76 connecting the various contact pads with one another. Traces 76 may extend on one or both surfaces of the circuit board and may also extend between the layers in a multilayer circuit board structure. Unit 75 is mounted to the circuit board by bonding mounting contacts 42 to some of the contact pads 74 on the top surface of the circuit board, as by fusing the bottom masses 42 to the contact pads. This operation is performed in a production plant adapted for attaching packaged semiconductor chips, modules and other components to the circuit board, an operation commonly referred to in the industry as "board stuffing." Board stuffing plants which employ surface mounting technology are commonly equipped with facilities for handling and placing components onto the circuit board, and with reflow equipment for momentarily heating the circuit board with the components thereon to fuse solder or otherwise activate bonding materials between the components and the contacts of the circuit board. If unit 75 does not have the bottom or mounting masses 44 in place when received at the plant, these masses may be applied on the circuit board or on the unit prior to mounting. Also, a flux (not shown) typically is applied on the masses or on the pads to facilitate the bonding operation. The flux may hold unit 75 in place prior to reflow.

Additional components 73 as, for example, additional packaged chips, multichip modules, discrete components and the like, may be mounted to the circuit board 70 in the same sequence of mounting operations so as to position terminals 79 of the additional components on additional contact pads 74a of the circuit board. Where the additional components are connected by masses of solder, a separate flux (not shown), may be applied to the contacts pads of the circuit board to hold the additional components in place prior to reflow. Alternatively or additionally, a solder paste may be applied on contact pads 74 or on terminals 79. The solder paste may holds the components in place prior to and during reflow. Placement of the components, including unit 75, onto the circuit board may be performed by conventional placement devices commonly used in mounting components on a circuit board in a circuit board stuffing operation. The entire circuit board and the components placed thereon may be subjected to a reflow operation after mounting unit 75 and additional components 73, so as to fuse the solder and bond contacts 79 of the additional microelectronic elements to contact pads 74 and also bond mounting pads 42 of unit 75 to the contact pads 74 of the circuit board. Alternatively, the reflow operation may be conducted sequentially, so that the solder associated with one or more components is reflowed prior to mounting one or more other components.

The subassembly resulting from applying the component to the circuit board is a semi-finished circuit board assembly. It includes the unit 75 as a first or bottom unit. The substrate 20 incorporated in the component has its upper surface 22 facing upwardly, away from the circuit board and has top connections in the form of top connection pads 36 and 38 open and unoccupied, so that these top connections or pads are available to receive additional microelectronic devices. In effect, the top surface 22 of the component substrate 20 forms an additional portion of the circuit board top surface 72.

Figure 4:
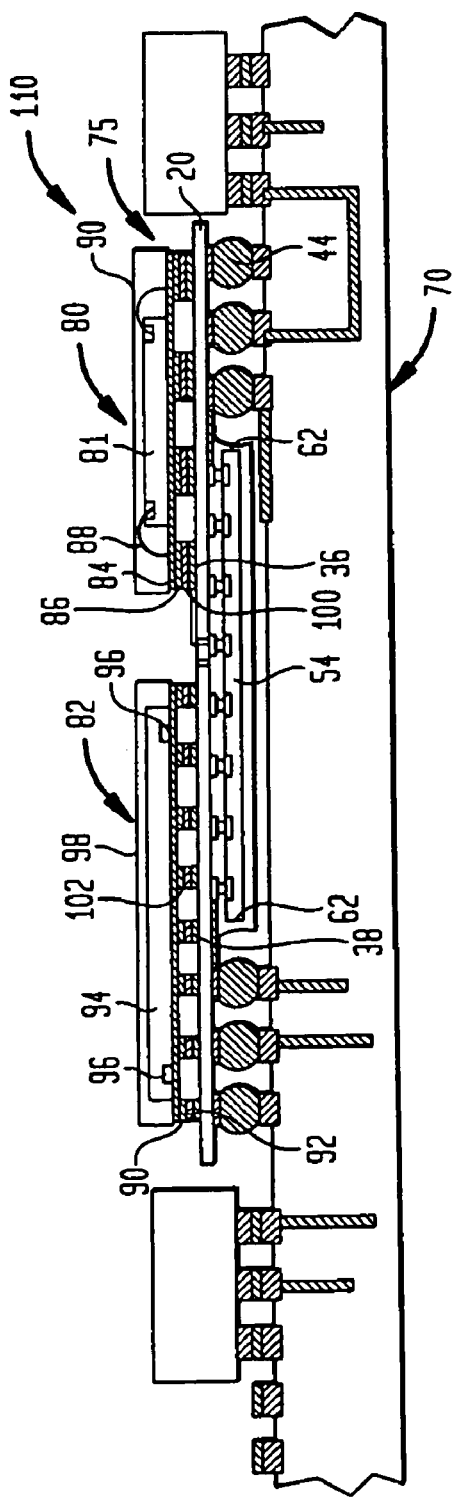
FIG. 4 is a view similar to FIG. 3 but depicting a finished assembly made from the semi-finished assembly of FIG. 3.

In the next stage of the process, additional microelectronic elements are mounted on top of unit 75 so as to overlie the top surface 22 of substrate 20. As best seen in FIG. 4, these additional microelectronic elements may include a first packaged semiconductor chip 80 and a second packaged semiconductor chip 82. As used in this disclosure, the term "packaged semiconductor chip" refers to a unit including both the actual semiconductor element or "bare die" itself, and one or more components or layers which cover at least one surface or edge of the bare die. A packaged chip may or may not have electrical connection elements distinct from the contacts of the bare die itself. As used in this disclosure, the term "standard packaged chip" refers to a packaged chip having electrical connection elements (whether or not distinct from the contacts of the bare die) disposed in a pattern conforming to an official or unofficial standard applicable to packaged chips. Most preferably, the standard packaged chips conform to a standard applicable to packaged chips intended for mounting to circuit boards. Most commonly, the packaged chips are made in plants separate from the circuit board stuffing plant. Many chips are commercially available from chip manufacturers or resellers in packaged form, most typically as standard packaged chips.

Figure 5:
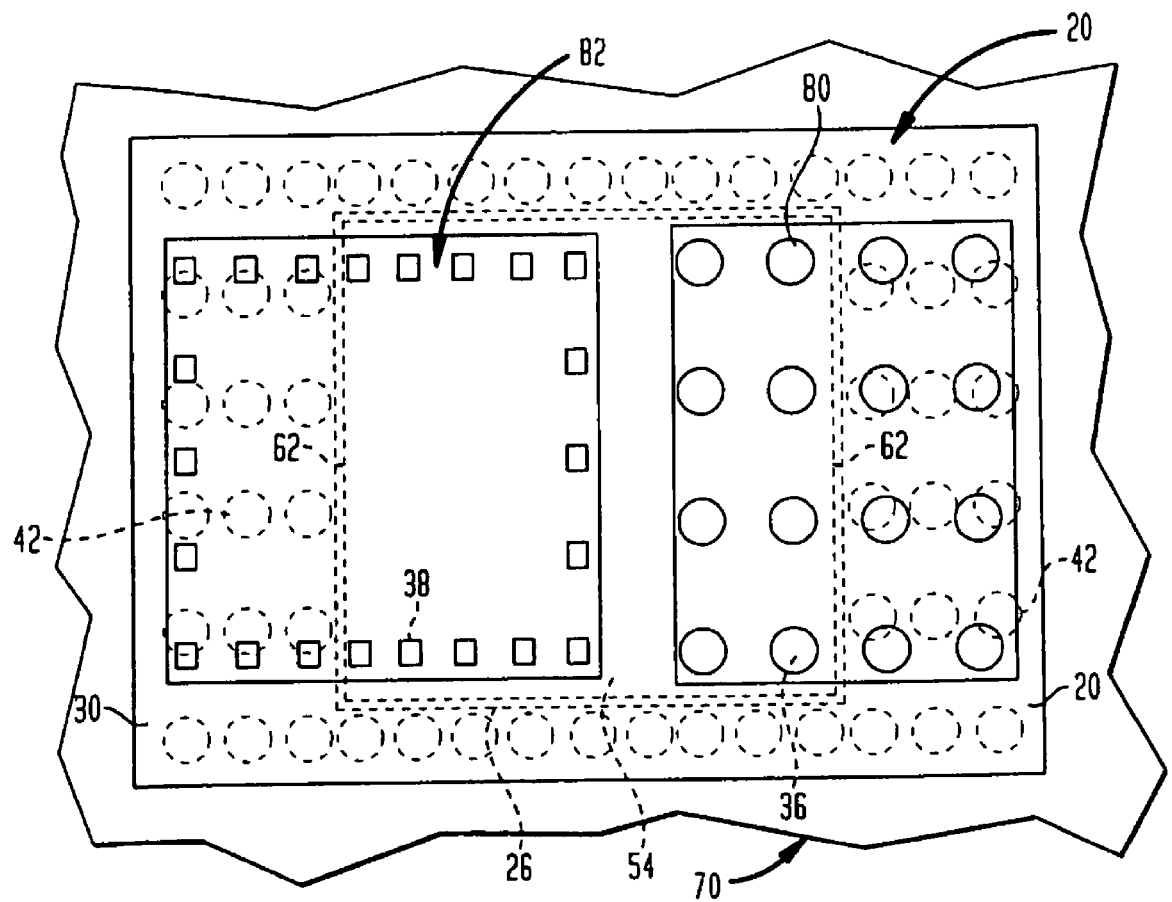
FIG. 5 is a diagrammatic top plan view of the assembly shown in FIG. 4.

In the embodiment of FIGS. 4 and 5, first packaged semiconductor chip 80 includes a package substrate 84 having terminals 86 exposed at a bottom surface of the package substrate and additional conductive elements (not shown) on such substrate. The bare die 81 is mounted to the top surface of substrate 84 in a "face-up" orientation, with the front or contact-bearing surface of the bare die facing away from substrate 84. The packaged chip also includes wire bonds 88 connecting the contacts of the bare die with terminals 86. The wire bonds may connect directly between the terminals 86 and the contacts of the bare die or, more typically, the wire bonds may be connected between the bare die and additional conductive elements on the substrate which, in turn, are connected to the terminals 86. Packaged chip 80 also includes an overmolded encapsulant 90 covering the die 81 and the wire bonds 88. The second top element or packaged chip 82 also includes a package substrate 90 with terminals 92 thereon and a bare die 94 disposed in a "face-down" orientation, with the front or contact-bearing surface of the die facing toward the substrate. The contacts of the die are connected by leads 96 and by further conductive traces (not shown) on the substrate to the contacts of die 94. Here again, an encapsulant or overmolding 98 covers the edges of die 94 and may also cover the rear surface of the die (the surface facing upwardly in FIG. 4). The particular configurations of packaged chips illustrated are merely exemplary. These particular packaged chips are of a configuration commonly employed for mounting directly to a circuit panel. Either or both of packaged chips 80 and 82 optionally may be arranged to permit appreciable movement of the terminals on the packaged chip with respect to the die incorporated in the packaged chip, so that such movement can relieve stresses encountered in service as, for example, stresses applied by differential thermal expansion during manufacture or use of the packaged chip. Packaged chips which can provide such movability are disclosed, for example, in certain preferred embodiments of U.S. Pat. Nos. 5,679,977; 6,054,756; and 5,518,964, the disclosures of which are hereby incorporated by reference herein. The packaged chips may be chip-size packaged chips, i.e., packaged chip which can be mounted in an area of a circuit panel equal to or only slightly larger than the area of the bare die front surface. Some or all of the terminals on the packaged chip may be disposed in alignment with the bare die incorporated in the packaged chip.

Packaged chips 80 and 82 are mounted on the bottom unit or component 75 by bonding the terminals 86 and 92 of the packaged chips to the top connection pads 36 and 38 of unit 75. This bonding operation uses standard surface mounting techniques of the type normally used to mount packaged chips to circuit boards. Most preferably, the bonding operation is performed in the board stuffing plant, using equipment and techniques similar to those used to mount the components to the circuit board. For example, the packaged chips 80 and 82 may be mounted using a small layer of solder paste applied on the top connection pads 36 and 38 or on terminals 92 and 86 prior to assembling the packaged chips to the unit. After the packaged chips 80 and 82 have been applied, the circuit board, with the unit 75 in place on the board and with packaged chips 80 and 82 on unit 75, is subjected to a further reflow operation so as to form thin layers of fused solder 100 between terminals 86 of the first packaged chip 80 and the associated top connection pads of unit 75 and to form fused, bonded solder connections 102 between the terminals 92 of second packaged chip 82 and the associated top connection pads 38 of unit 75. Desirably, the layers of solder 100 and 102 are less than about 40 microns thick, and most desirably between about 10 and about 20 microns thick. The thickness or height of these solder layers, thus, is substantially less than the thickness or height of the bottom masses 44 used to mount unit 75 to circuit board 70.

In an alternative process, the solder in bottom masses 44 is not reflowed prior to mounting the top units or packaged chips 80 and 82. Thus, the semi-finished assembly of the circuit board 70 and bottom unit 75 has the bottom unit temporarily secured in place by flux, solder paste or other temporary securement. In this process, the solder in mounting masses 44 is reflowed simultaneously with the solder forming connections 100 and 102, so as to form bonds between mounting pads 42 of unit 75 and contact pads 74 of the circuit board. The same operation may also cause reflow the solder between the terminals 79 of additional elements 73 and the contact pads 74 of the circuit board.

In the completed assembly 110, as best appreciated with reference to FIG. 5, the first packaged chip 80 extends in part over the central region 26 of substrate 20 and in part over the first peripheral region 28 of the substrate. The second packaged chip 82 extends in part over the central region 26 and in part over the second peripheral region 30 of the substrate. Thus, each of the packaged chips or top units 80 and 82 partially overlies the central region and, hence, the bottom chip 54; but each of the packaged chips or top units also extends in part into the peripheral region. This allows the assembly to accommodate packaged chips which, in the aggregate, have a surface area greater than the surface area of bottom chip 54. Although both packaged chips 80 and 82 project outwardly (in horizontal directions, in the plane of the drawing in FIG. 5) beyond edges 62 of the bottom chip 54, the space beneath the projecting portions of the packaged chips is not wasted but, instead, is occupied by the mounting pads 42 and the associated bottom masses 44 (FIG. 4) disposed in the peripheral regions of the substrate.

The joints 100 and 102 between the top elements packaged chips 80 and 82 and bottom unit 75 desirably are not underfilled. This avoids the need for special processes, not commonly used in a board stuffing plant, to apply such an underfill. Moreover, the packaged chips or top elements 80 and 82 can be removed, if necessary, using standard circuit board rework techniques such as application of heat to melt the bonding material and replaced by other packaged chips. Stated another way, the top elements 80 and 82 can be detached from substrate 20 using conventional techniques without destroying the substrate. The term "removably connected", as used herein, refers to a connection which can be removed without destroying the substrate. The attachment between the top elements and the substrate is thus more readily detachable than the attachment between bottom chip 54 and the substrate.

An underfill normally is not required to provide adequate reliability and resistance to thermal cycling stresses in the joints between the top packaged chips 80 and 82 and the substrate 20. The top conductive bonding materials 100 and 102 are at least partially protected from stresses by the bottom unit and mounting masses. The relatively large mounting masses typically have significant capacity to flex and accommodate differential expansion of the components. At least in the central region 26 of the substrate, the expansion and contraction of the substrate is constrained by the bottom chip 54 and underfill 66, and is relatively well matched to the expansion and contraction of packaged chips 80 and 82. Further, the substrate 20 of the bottom unit desirably can flex to at least some degree to take up differences in expansion and contraction. As mentioned above, the packaged chips themselves optionally can incorporate features which allow movement of their terminals relative to the dies contained in these packages.

The multichip assembly 110 including unit 75 and packaged chips 80 and 82 occupies significantly less area on the top surface of circuit board 70 than would be required to mount chips 54, 80 and 82 separately to the circuit board. Also, interconnections between chips 80, 82 and 54 incorporated in this assembly are routed through the traces of substrate 20 in the stacked assembly and, accordingly, need not be accommodated by traces in circuit board 70 itself. This reduces the complexity of the interconnections required in the circuit board. In some cases, this can reduce the number of layers required in circuit board 70 as a whole. The assembly, and assembly method thus advantages similar to those achievable in a stacked chip arrangement where bare dies are specially mounted in a stacked configuration. However, packaged chips 80 and 82 need not be provided in special packaging arrangements, but instead can be standard chips of the type normally used for mounting directly to a circuit board. Many types of chips are available in standard, pre-packaged configurations in great quantities and at low prices from numerous sources. For example, memory chips are available in standard packaged configurations from numerous manufacturers. The ability to use such standard chips in fabricating the stacked assembly significantly reduces the cost of the assembly and significantly simplifies procurement of these chips. The circuit board stuffing plant owner can procure essentially identical packaged chips from numerous sources in a competitive marketplace.

Additionally, the assembly 110 and, hence, the finished circuit board incorporating the assembly can be customized by varying the packaged chips incorporated in assembly 110. The assembly operation can be repeated numerous times to produce numerous circuit assemblies using substantially identical bottom units. The configuration of the assembly can be varied by varying the top elements or packaged chips 80 and 82. For example, in fabricating cellular telephones, different types of static random access memory or SRAM and different types or sizes of flash memory may be provided as the top microelectronic elements or packaged chips in different assemblies, all of which use a bottom unit incorporating the same baseband ASIC or FPGA. It is not necessary to prepare pre-assembled stacked chip packages, in a chip packaging operation, in accordance with all of the various combinations.

In a variant of the manufacturing process discussed above, the top microelectronic elements, such as first and second packaged chips 80 and 82, are mounted to unit 75 so as to form assembly 110 before installing the assembly on circuit board 70. For example, substrate 22 may be provided in the form of a large sheet or, preferably, a continuous tape incorporating a plurality of regions, each such region of the sheet or tape having mounted thereon one bottom chip 54 and the associated top connection pads 36 and 38 and mounting pads 42 and other features as discussed above. The top elements, such as first and second chips 80 and 82, can be mounted to each region of the sheet or tape while the sheet or tape remains in this form. Here again, however, the process of mounting the first and second packaged chips requires essentially the same techniques as are used in mounting chips to a circuit board as, for example, solder and/or flux application and reflowing. Thus, this operation can be performed readily in a circuit board stuffing plant with ordinary fixturing. Here again, the advantages achieved by assembling the units in the circuit board stuffing operation and the advantages associated using standard packaged chips can be provided.

Figure 6:
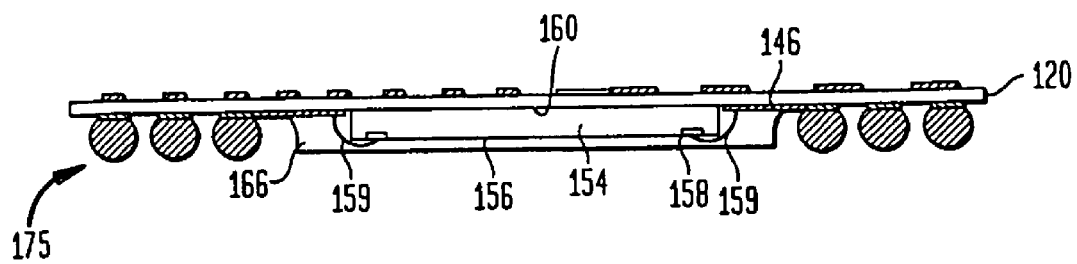
FIG. 6 is a diagrammatic sectional view depicting a component according to a further embodiment of the invention.

A unit 175 in accordance with another embodiment of the invention (FIG. 6) is similar to the unit 75 discussed above with reference to FIGS. 1-5. In unit 175, however, bottom chip 154 is mounted in what would commonly be regarded as a "face-up" orientation relative to the substrate 120, i.e., with the front or contact-bearing surface 156 facing away from the substrate and with the rear surface 160 facing toward the substrate. The contacts 158 of the bottom chip are connected to conductive features 146 of substrate 120 by wire bonds 159. Here again, the bottom chip is assembled into the unit in a chip packaging operation and is secured substantially permanently to substrate 120. For example, the rear surface 160 of the bottom chip may be bonded to the substrate 120 by a die attach adhesive (not shown). Also, an encapsulant 166 covers at least that portion of the bottom chip bearing contacts 158 and further secures the bottom chip in place on the bottom surface of substrate 120. The encapsulant also protects the wire bonds 159. A unit in accordance with this embodiment of the invention may be handled and processed and converted into an assembly in essentially the same way as the unit discussed above.

Figure 7:
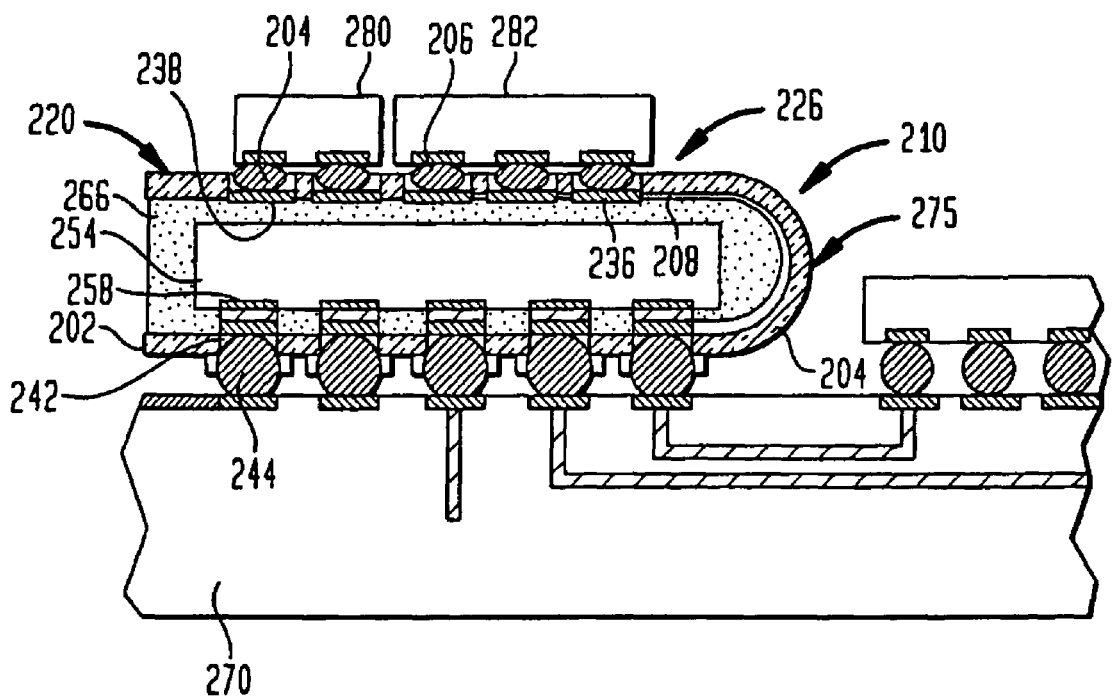
FIGS. 7 and 8 are views similar to FIG. 4 but depicting assemblies including components according to further embodiments of the invention.

An assembly 210 in accordance with a further embodiment of the invention incorporates a bottom unit 275 which, once again, incorporates a bottom unit chip 254 permanently mounted to a substrate 220. In this embodiment, however, the configuration of the substrate differs from those discussed above. Substrate 220 incorporates an upper region 226 extending over the bottom chip 254. Here again, top connection pads 238 and 236 are carried on the substrate. Some or all of the top connection pads overlie the bottom unit chip. The substrate 220 also includes a bottom portion 202 extending beneath the bottom unit 254. The substrate also has a connecting portion or fold 204 extending upwardly from the bottom portion to the upper portion 220. Traces 208 extend along the substrate and interconnect at least some of the various pads with one another. The mounting or bottom contact pads 242 in this embodiment are disposed on the bottom portion of the substrate and, hence, are disposed beneath the bottom unit chip 254. The connections between the contacts 258 of the bottom unit chip and the mounting pads 242 are depicted in FIG. 7 as simple solder bonds, but any other type of connection may be employed. For example, the bottom unit chip may be connected by leads or wire bonds to the mounting pads 242. An encapsulant 266 may fill the space between the upper and lower portions of the substrate and may permanently secure the bottom unit chip to the substrate. Units in accordance with this embodiment of the invention may be handled and assembled with top microelectronic elements as indicated schematically at 280 and 282 and with a circuit board 270 in a manner similar to that described above. Here again, the solder or other bonding material 204 and 206 used to connect the top units desirably has a lower height than the bottom masses 244 which serve to connect the mounting pads 242 to the contact pads of the substrate. Because the bottom masses 244 are disposed beneath the bottom unit chip 254, the overall height of the assembly in this embodiment includes the height of the bottom masses as well as the height of the bottom unit chip, in addition to the height of the top units. However, the relatively low height of the solder used to attach the top units minimizes the overall height of the assembly. Also, the overall height of the assembly is further minimized by positioning the bottom masses 244 so that they extend at least partially through the thickness of the substrate, i.e., at least partially through the bottom portion of the substrate. Mounting pads 242 desirably are disposed on or near the inner or upper surface of the substrate, i.e., at or near the surface of the substrate facing away from the circuit board 270 and towards the bottom chip 254. The structure of the substrate may be similar to the structure of the substrate used in the adaptors discussed in co-pending, commonly assigned U.S. Provisional Patent Application Ser. No. 60/401,391 entitled "Microelectronic Adaptors, Assemblies And Methods," filed Aug. 5, 2002 naming Philip Damberg as the inventor, and in the further co-pending, commonly assigned U.S. patent application Ser. No. 10/236,442, also entitled "Microelectronic Adaptors, Assemblies And Methods," filed on Sep. 6, 2002, and also naming Philip Damberg as the inventor and claiming benefit of said provisional application 60/401,391, the disclosures of both of said applications being hereby incorporated by reference herein.

Figure 8:
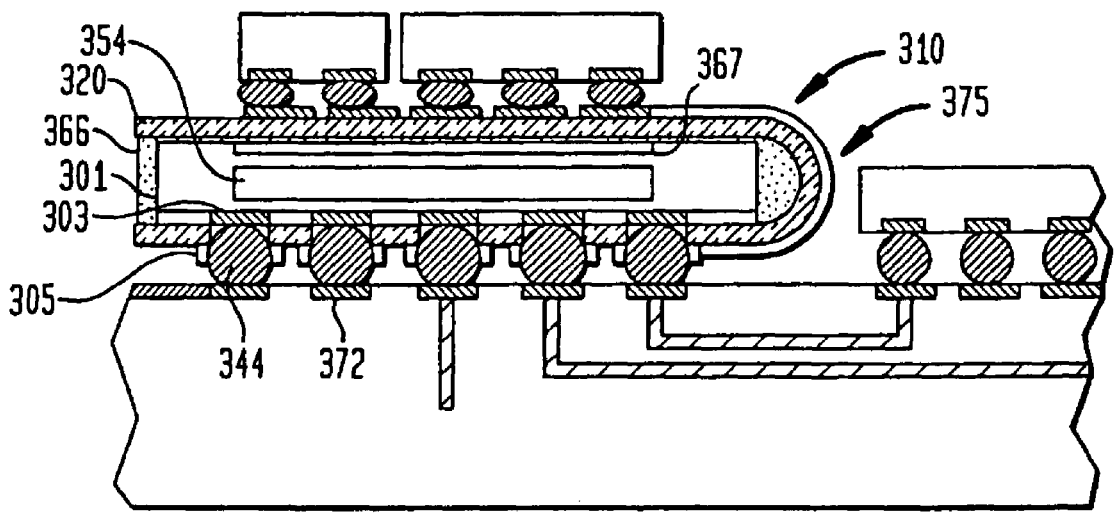

In an assembly 310 according to a further embodiment of the invention (FIG. 8), the bottom unit 375 incorporates a bottom unit chip 354 which itself is part of a packaged chip 301. The mounting pads of the bottom unit in this particular embodiment are the mounting pads 303 of packaged chip 301. As further described in the aforementioned co-pending applications, the bottom unit 375 can be fabricated by assembling a packaged chip or other device with an adaptor including a substrate 320 and socket contacts 305 arranged to engage masses 344 of bonding material extending from mounting pads 303 to contact pads 372 on the circuit board. Such a bottom unit itself can be fabricated readily in the circuit board stuffing plant.

In this embodiment, the bonding material masses 344 extend entirely through the substrate and entirely through the substrate contacts. Here again, the bottom unit chip 354 may be permanently secured to the substrate as, for example, by a further encapsulant 366 or by an adhesive layer 367 securing a portion of the substrate to the overmolding of the packaged chip 301, or both. Alternatively, the bottom unit chip may be connected to the substrate so that it can be removed from the substrate.

Packaged chips can also be used to provide the bottom unit chips in the other embodiments discussed above. The ability to use packaged chips further simplifies the procurement process and avoids the need to procure any chips in packages specially adapted for stacking.

Figure 9:
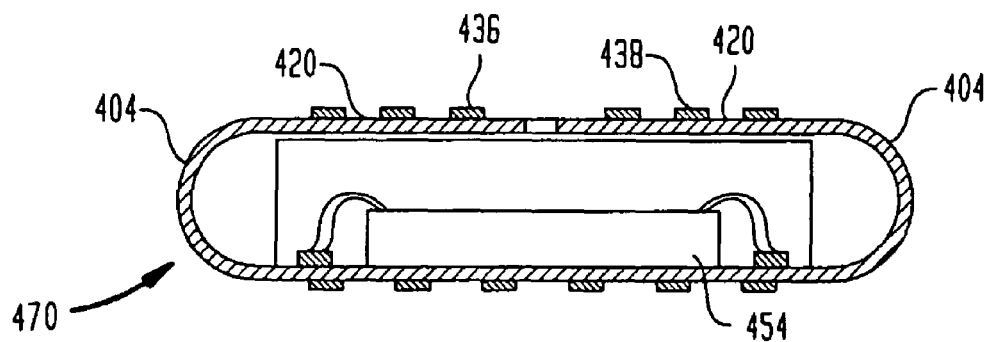
FIG. 9 is a diagrammatic, partially sectional view depicting a component in accordance with a further embodiment of the invention.

As seen in FIG. 9, and as also discussed in greater detail in the co-pending applications incorporated by reference, a folded substrate 420 may have two separate folded portions 404 extending from beneath the bottom unit chip 454 and merging with two upper portions 420 carrying separate groups of top connection pads 436 and 438. The two separate upper portions 420 cooperatively form a portion of the substrate extending above the bottom unit chip and carrying the top connection pads.

In a further variant (FIG. 10) the bottom unit chip 554 is mounted with its front or contact-bearing surface 556 facing toward the bottom unit substrate 520, and with the contacts 558 of the bottom unit chip aligned with a bond window or opening 502 extending through the substrate in the central region of the substrate. The contacts of the bottom unit chip are connected to traces 548 on substrate 520 by leads 504 integral with the traces extending over the bond window. For example, the lead structures and techniques disclosed in U.S. Pat. No. 5,915,752, the disclosure of which is incorporated by reference herein, can be employed. An encapsulant 506 covers the leads and bond window. A further encapsulant 508 and a die attach material (not shown) disposed between the bottom chip 554 and the substrate may optionally further mechanically attach the bottom chip to the substrate. The rear surface 557 of the bottom chip may be covered by encapsulant 558 or may be left bare for enhanced heat transfer to a circuit board in the finished assembly. In a further variant, the bottom unit may include a heat transfer element such as a metallic sheet which can be bonded to a corresponding element on the circuit board when the bottom unit is mounted on the circuit board.

Figure 10:
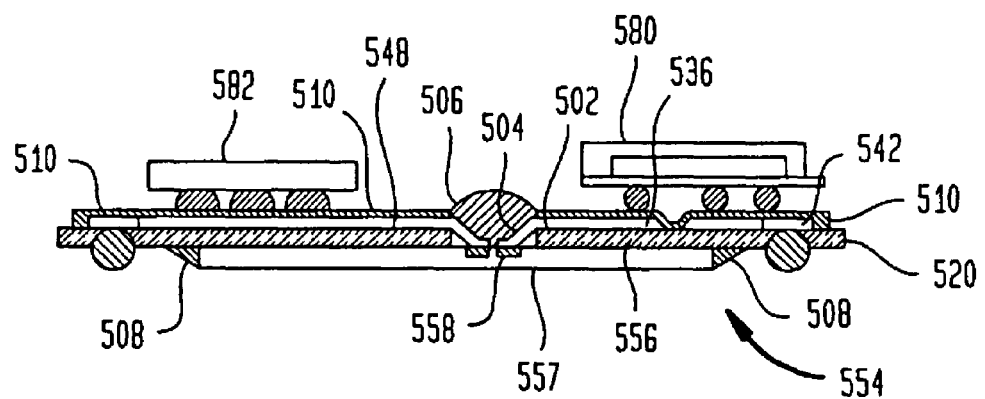
FIG. 10 is a diagrammatic sectional view of a component according to yet another embodiment of the invention.

Top microelectronic elements such as packaged chips 580 and 582 are mounted to the substrate and connected to top connection pads 536 in a manner similar to that discussed with reference to FIGS. 1-5. In the embodiment of FIG. 10, the packaged chips lie outside of the area of the substrate occupied by the bond window, and accordingly are clear of encapsulant 506. In the embodiment of FIG. 10, the traces 548, top connection pads 536 and mounting pads 542 all are physically disposed on the top or outer surface of the substrate. The mounting pads 542 are exposed to the bottom or inner surface (the surface facing downwardly in FIG. 10) through holes in the substrate, so that solder masses 544 may be connected to the mounting pads and may project downwardly. Also, as seen in FIG. 10, a solder mask layer 510 may cover the traces 548 and other conductive features. The solder mask layer has openings aligned with the top connection pads 536.

Figure 11:
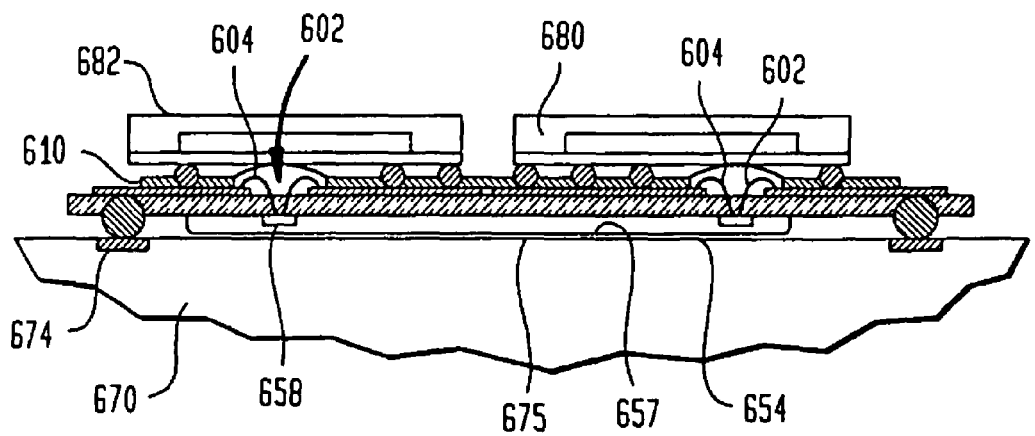
FIG. 11 is a view similar to FIG. 10 but depicting a component in accordance with a still further embodiment of the invention in conjunction with a circuit panel.

The unit depicted in FIG. 11 is similar to the unit of FIG. 10, except that the bottom unit chip 654 has multiple rows of contacts 658, and these contacts are connected to the traces by wire bonds 604 rather than by leads formed integrally with the traces. The substrate has multiple bond windows aligned with the multiple rows of contacts. Also, the top microelectronic elements 680 and 682 overlie the bond windows. In this arrangement, the encapsulant which fills the bond windows desirably is flush with the solder mask layer 610 or projects only slightly above such layer as, for example, about 10-20 microns above the solder mask layer. The wire bonds 604 desirably have as low a profile as possible to allow such a low encapsulant height. The top connection pads 636 and 638 are arranged in areas of the substrate encompassing the bond windows. The arrangement of FIG. 11 also can be employed with integral leads as shown in FIG. 10. Also, both configurations can be made with the traces and other conductive features on the inner surface of the substrate, facing toward the bottom unit chip, and with the top connection pads exposed to the outer or upper surface of the substrate through holes in the substrate. These arrangements can be made with only a single layer of metallic features on the substrate or, where required to accommodate more complex routing, with metallic features on both sides of the substrate. Similar features can be used in a folded-substrate unit as discussed above with reference to FIGS. 7-9.

FIG. 11 depicts the completed assembly with the unit mounted on a circuit board 670 having contact pads 674. The circuit board also has a thermal conductor or die bond area 675, desirably a large metallic feature. The rear surface 657 of the bottom unit chip may closely overlie this thermal conductor, and may be bonded to the thermal conductor by a thermally conductive material as, for example, a solder.

In the foregoing description, terms such as "top", "bottom", "upwardly" and "downwardly" refer to the frame of reference of the microelectronic element, unit or circuit board. These terms do not refer to the normal gravitational frame of reference.

As used in this disclosure, a terminal or other conductive feature is regarded as "exposed at" a surface of a dielectric element where the terminal is arranged so that all or part of the conductive feature can be seen by looking at such surface. Thus, a conductive feature which is exposed at a surface of a dielectric element may project from such surface; may be flush with such surface; or may be recessed from such surface and exposed through an opening extending entirely or partially through the dielectric element.

Numerous variations and combinations of the features discussed above can be employed. For example, although the bottom units depicted in the drawings include only one bottom unit chip in each bottom unit, similar units can be made with two or more bottom unit chips. Additionally, a die may have contacts formed on its rear surface, or in recesses open to the rear surface, in addition to the contacts on the front surface. For example, dies formed from certain compound semiconductors such as gallium arsenide sometimes include rear-surface contacts which are used to provide ground or power connections, and for additional thermal conduction from the die. Also, the number of top elements or packaged chips can be reduced or increased. Top elements other than packaged chips as, for example, passive components can be employed. Further, bonding materials other than solder can be used. As these and other variations and combinations of the features discussed above can be utilized, the foregoing description of the preferred embodiment should be taken by way of illustration rather than by way of limitation of the invention as defined by the claims.

The invention claimed is:

1. A method of operating a circuit board stuffing production plant, the method comprising:
    (a) in the board stuffing plant, mounting bottom units, each including one or more chips, to circuit boards by temporarily securing bottom sides of said units to the circuit boards,
    (b) procuring packaged chips;
    (c) mounting said packaged chips to top sides of said units in the board stuffing plant; and
    (d) concurrently connecting, in the board stuffing plant, said mounted chips to top connections on said top sides of said units and said mounted circuit boards to board connections on said bottom sides of said units.

2. A method as claimed in claim 1 wherein said step of procuring packaged chips includes procuring packaged chips of the same functionality from a plurality of sources.

3. A method as claimed in claim 1 wherein said top connections include top contacts overlying the one or more chips of each said bottom chip unit, and wherein said concurrently connecting step includes connecting the packaged chips to the top contacts overlying the chips of the bottom units.

4. A method as claimed in claim 1 wherein said packaged chips are standard packaged chips.

5. A method as claimed in claim 1 wherein said step of mounting said packaged chips to said top sides of said bottom units is performed using the same production line as said step of mounting said bottom units to said circuit boards.

6. A method as claimed in claim 1 further comprising the step of procuring said bottom units from one or more sources external to the board stuffing plant.

7. A method as claimed in claim 1 further comprising the step of fabricating said bottom units in said board stuffing plant.

8. A method as claimed in claim 1 wherein said concurrently connecting step includes concurrently reflowing solder disposed between the mounted chips and the top connections on the top sides of the units and solder disposed between the mounted circuit boards and the board connections on the bottom sides of the units.

9. A method of operating a circuit board stuffing production plant, the method comprising:
    (a) mounting, in the board stuffing plant, a bottom unit that includes one or more chips to a circuit board by temporarily securing a bottom side of the unit to the circuit board;
    (b) procuring one or more packaged chips;
    (c) mounting the one or more packaged chips to a top side of the unit in the board stuffing plant; and
    (d) concurrently connecting, in the board stuffing plant, the mounted chips to top connections on the top side of the unit and the mounted circuit board to board connections on the bottom side of the unit.

10. A method as claimed in claim 9 wherein said concurrently connecting step includes concurrently reflowing solder disposed between the mounted chips and the top connections on the top side of the unit and solder disposed between the mounted circuit board and the board connections on the bottom side of the unit.

11. A method as claimed in claim 9 wherein said step of procuring the one or more packaged chips includes procuring a plurality of packaged chips of the same functionality from a plurality of sources.

12. A method as claimed in claim 9 wherein the top connection includes top contacts overlying the one or more chips of the bottom unit, and wherein said step of concurrently connecting the one or more packaged chips includes connecting the packaged chips to the top contacts overlying the chips of the bottom unit.

13. A method as claimed in claim 9 wherein said packaged chips are standard packaged chips.

14. A method as claimed in claim 9 wherein said step of mounting said one or more packaged chips to said top side of said bottom unit is performed using the same production line as said step of mounting said bottom unit to said circuit board.

15. A method as claimed in claim 9 further comprising the step of procuring said bottom unit from one or more sources external to the board stuffing plant.

16. A method as claimed in claim 9 further comprising the step of fabricating said bottom unit in said board stuffing plant.

* * * * *